(12) United States Patent  
Li et al.

(10) Patent No.: US 10,818,732 B2  
(45) Date of Patent: Oct. 27, 2020

(54) PHOTOSENSITIVE SENSOR, MANUFACTURING METHOD OF THE SAME, AND ELECTRONIC DEVICE

(71) Applicant: BOE TECHNOLOGY GROUP CO., LTD., Beijing (CN)

(72) Inventors: Shipei Li, Beijing (CN); Wusheng Li, Beijing (CN); Qi Yao, Beijing (CN); Dongsheng Li, Beijing (CN); Fang He, Beijing (CN); Huili Wu, Beijing (CN); Renquan Gu, Beijing (CN); Sheng Xu, Beijing (CN); Wei He, Beijing (CN); Dongsheng Yin, Beijing (CN); Ying Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/574,055

(22) Filed: Sep. 17, 2019

(65) Prior Publication Data  
US 2020/0091246 A1 Mar. 19, 2020

(51) Int. Cl.  
*H01L 27/30* (2006.01)  
*H01L 51/00* (2006.01)  
(Continued)

(52) U.S. Cl.  
CPC .......... *H01L 27/307* (2013.01); *H01L 51/003* (2013.01); *H01L 51/0097* (2013.01);  
(Continued)

(58) Field of Classification Search  
CPC ..... H01L 27/30; H01L 27/301; H01L 27/305; H01L 27/307; H01L 27/308;  
(Continued)

(56) References Cited

U.S. PATENT DOCUMENTS 8,754,413 B2 * 6/2014 Lee .................. H01L 27/14663  
257/443  
2003/0086046 A1 * 5/2003 You .................... G02F 1/133555  
349/149  
(Continued)

FOREIGN PATENT DOCUMENTS

CN 105095872 A 11/2015  
CN 206058227 U 3/2017  
(Continued)

OTHER PUBLICATIONS

First Chinese Office Action dated Mar. 18, 2020, received for corresponding Chinese Application No. 201811086483.6, 12 pages.

*Primary Examiner* — Karen Kusumakar  
(74) *Attorney, Agent, or Firm* — Kinney & Lange, P.A.

(57) ABSTRACT

A photosensitive sensor and a method of manufacturing the photosensitive sensor are disclosed. The photosensitive sensor includes a thin film transistor and a photosensitive element on a substrate, wherein the photosensitive element includes a first electrode, a second electrode, and a photosensitive layer between the first electrode and the second electrode. The second electrode is connected to a drain electrode of the thin film transistor. An orthographic projection of an active layer of the thin film transistor on the substrate is within an orthographic projection of the second electrode on the substrate. The second electrode includes at least two stacked conductive layers, at least one of the at least two stacked conductive layers being a light shielding metal layer.

16 Claims, 4 Drawing Sheets

(51) Int. Cl.
    *H01L 51/44*      (2006.01)
    *H01L 29/786*     (2006.01)
(52) U.S. Cl.
    CPC ........ *H01L 51/442* (2013.01); *H01L 29/7869* (2013.01); *H01L 29/78633* (2013.01); *H01L 29/78669* (2013.01); *H01L 2251/308* (2013.01)
(58) Field of Classification Search
    CPC . H01L 51/0021; H01L 51/42; H01L 51/4293; H01L 51/441; H01L 51/442; H01L 51/003; H01L 51/0097; H01L 29/78669; H01L 29/78633; H01L 2251/308; H01L 29/7869; H01L 51/4206
    See application file for complete search history.

(56)                References Cited

U.S. PATENT DOCUMENTS

| | | |
|---|---|---|
| 2017/0161541 A1 | 6/2017 | Li et al. |
| 2018/0337196 A1* | 11/2018 | Yang ..................... H01L 27/124 |
| 2019/0013368 A1* | 1/2019 | Chung ................ H01L 27/3234 |
| 2019/0019813 A1 | 1/2019 | Ren et al. |
| 2020/0058680 A1 | 2/2020 | Liu |

FOREIGN PATENT DOCUMENTS

| | | |
|---|---|---|
| CN | 107359168 A | 11/2017 |
| CN | 108336100 A | 7/2018 |

* cited by examiner

PHOTOSENSITIVE SENSOR, MANUFACTURING METHOD OF THE SAME, AND ELECTRONIC DEVICE

CROSS-REFERENCE TO RELATED APPLICATION

This application claims priority to the Chinese patent application No. 201811086483.6 filed in China on Sep. 18, 2018, a disclosure of which is incorporated herein by reference in its entirety.

TECHNICAL FIELD

The present disclosure relates to the field of display technology, and in particular, relates to a photosensitive sensor, a method of manufacturing the photosensitive sensor, and an electronic device.

BACKGROUND

Optical sensors have a tendency to be lightweight and widely used. In related photosensitive sensors, a thin film transistor is combined with a photosensitive element. External light may affect performance of the thin film transistor.

SUMMARY

The present disclosure provides a photosensitive sensor, a method of manufacturing the photosensitive sensor, and an electronic device.

In a first aspect, a photosensitive sensor is provided. The photosensitive sensor includes a thin film transistor and a photosensitive element on a substrate, wherein the photosensitive element includes a first electrode, a second electrode, and a photosensitive layer between the first electrode and the second electrode; the second electrode is connected to a drain electrode of the thin film transistor; an orthographic projection of an active layer of the thin film transistor on the substrate is within an orthographic projection of the second electrode on the substrate; the second electrode includes at least two stacked conductive layers, at least one of the at least two stacked conductive layers is a light shielding metal layer.

Optionally, the photosensitive layer is made of an organic photosensitive material.

Optionally, one of the at least two stacked conductive layers is in contact with the photosensitive layer and is made of indium tin oxide.

Optionally, the second electrode includes three conductive layers, and the three conductive layers are formed of indium tin oxide silver, and indium tin oxide, respectively.

Optionally, the first electrode is a transparent conductive layer.

Optionally, the light shielding metal layer is formed of at least one of Cu, Ag, Al, Mo, or Ti.

Optionally, the substrate is a flexible substrate.

Optionally, the thin film transistor includes: a gate electrode on the flexible substrate; a gate insulating layer on the gate electrode; an active layer and a source electrode connected to the active layer and a drain electrode connected to the active layer on the gate insulating layer; the photosensitive sensor further includes a passivation layer on the active layer, the source electrode and the drain electrode of the thin film transistor, and a planarization layer on the passivation layer.

Optionally, the second electrode is connected to the drain electrode of the thin film transistor through a via hole penetrating through the planarization layer and the passivation layer.

In a second aspect, an electronic device is further provided in the present disclosure. The electrode device includes the photosensitive sensor according to the above.

In a third aspect, a method of manufacturing a photosensitive sensor is further provided in the present disclosure. The method includes: forming a thin film transistor, a first electrode of a photosensitive element, a second electrode of the photosensitive element, and a photosensitive layer of the photosensitive element between the first electrode and the second electrode on a substrate; wherein, forming the second electrode includes: forming the second electrode by using at least two stacked conductive layers, wherein the second electrode is connected to a drain electrode of the thin film transistor through a via hole, an orthographic projection of an active layer of the thin film transistor on the substrate is within an orthographic projection of the second electrode on the substrate, at least one of the at least two stacked conductive layers is a light shielding metal layer.

Optionally, one of the at least two stacked conductive layers is in contact with the photosensitive layer and is made of indium tin oxide.

Optionally, forming the second electrode specifically includes: forming the second electrode including three conductive layers, wherein the three conductive layers are respectively made of indium tin oxide, silver, and indium tin oxide.

Optionally, the light shielding metal layer is formed of at least one of Cu, Ag, Al, Mo, or Ti.

Optionally, the substrate is a flexible substrate, forming the thin film transistor, the first electrode of the photosensitive element, the second electrode of the photosensitive element, and the photosensitive layer of the photosensitive element between the first electrode and the second electrode on the substrate, specifically includes: providing a rigid substrate; forming the flexible substrate on the rigid substrate; forming a gate electrode of the thin film transistor on the flexible substrate; forming a gate insulating layer covering the gate electrode; forming an active layer of the thin film transistor on the gate insulating layer; forming a source electrode and a drain electrode of the thin film transistor, wherein the source electrode and the drain electrode are connected to the active layer; forming a passivation layer covering the active layer, the source electrode, and the drain electrode of the thin film transistor; forming a planarization layer on the passivation layer; forming the second electrode on the planarization layer, wherein the second electrode is connected to the drain electrode through a via hole penetrating through the passivation layer and the planarization layer; forming the photosensitive layer on the second electrode; forming the first electrode on the photosensitive layer.

Optionally, the method further includes stripping the flexible substrate off the rigid substrate to form a flexible photosensitive sensor.

DETAILED DESCRIPTION

In order to make technical problems, technical solutions, and advantages of the embodiments of the present disclosure more apparent, the present disclosure will be described in detail in conjunction with accompanying drawings and specific embodiments.

In a related photosensitive sensor, a thin film transistor is combined with a photosensitive element. When the photosensitive element is illuminated by light, charges in the photosensitive element is transmitted to a reading line connected to the thin film transistor via the thin film transistor, and an electrical signal is transmitted to a processing circuit by the reading line so as to realize detection of an optical signal. In order to avoid an influence on performance of the thin film transistor by external light, an active layer of the thin film transistor needs to be shielded.

Embodiments of the present disclosure provide a photosensitive sensor, a method of manufacturing the photosensitive sensor, and an electronic device. The photosensitive sensor, the method of manufacturing the photosensitive sensor, and the electronic device may not only shield the active layer of the thin film transistor to ensure the performance of the photosensitive sensor, but also simplify a structure and a manufacturing process of the photosensitive sensor to improve productivity of the photosensitive sensor.

The embodiments of the present disclosure provide a photosensitive sensor. The photosensitive sensor includes: a thin film transistor and a photosensitive element on a substrate, wherein the photosensitive element includes a first electrode, a second electrode, and a photosensitive layer between the first electrode and the second electrode; the second electrode is connected to a drain electrode of the thin film transistor; an orthographic projection of an active layer of the thin film transistor on the substrate is within an orthographic projection of the second electrode on the substrate; the second electrode includes at least two conductive layers stacked one above another, at least one of the at least two conductive layers is a light shielding metal layer.

In some embodiments of the present disclosure, the second electrode includes the light shielding metal layer, and the second electrode may shield the active layer of the thin film transistor to prevent external light from being irradiated onto the active layer of the thin film transistor and thus affect performance of the thin film transistor. Therefore, the structure and the manufacturing process of the photosensitive sensor may be simplified, and the productivity of the photosensitive sensor may be improved.

In specific embodiments, the photosensitive layer may be an organic photosensitive material, and the organic photosensitive material will generate electric charges after being irradiated by infrared light or X-rays, and thus may be applied to scenes of fingerprint recognition, facial recognition or X-ray recognition.

In a case that the photosensitive layer is made of the organic photosensitive material, a conductive layer of the at least two conductive layer is in contact with the photosensitive layer and is made of ITO (indium tin oxide), in order to match a work function of the organic photosensitive material and effectively lead out the electric charges generated by the organic photosensitive material. The ITO is matched with the work function of the organic photosensitive material, and may effectively lead out the electric charges generated by the organic photosensitive material.

In the at least two conductive layers stacked one above another, the light shielding metal layer may be a metal layer made of Cu, Ag, Al, Mo, or Ti, as long as the metal layer may block the light. Optionally, the light shielding metal layer is made of Ag, because the Ag and the ITO may be etched by using the same etching liquid, so that when a pattern of the second electrode is formed by using a wet etching process, the etching liquid is not required to be replaced, and only the same etching liquid may etch both the Ag and the ITO.

The second electrode may include two, three or more conductive layers. In a specific example, the second electrode includes three conductive layers, and the three conductive layers are made of ITO, Ag, and ITO, respectively.

In order to irradiate external light onto the photosensitive layer, the first electrode needs to be designed to be transparent, and the first electrode may be a patterned metal pattern or an entire layer of transparent conductive layer. Optionally, the first electrode is formed as an entire layer of transparent conductive layer, such that the first electrode may be arranged to an entirety of a surface of the photosensitive sensor, so that a uniform electric field is generated between the entirely planar second electrode and the first electrode and is favorable to photo-generated charges.

Further, the substrate may be a flexible substrate such that the photosensitive sensor is a flexible photosensitive sensor that may be applied to a wearable device.

Figure 1:
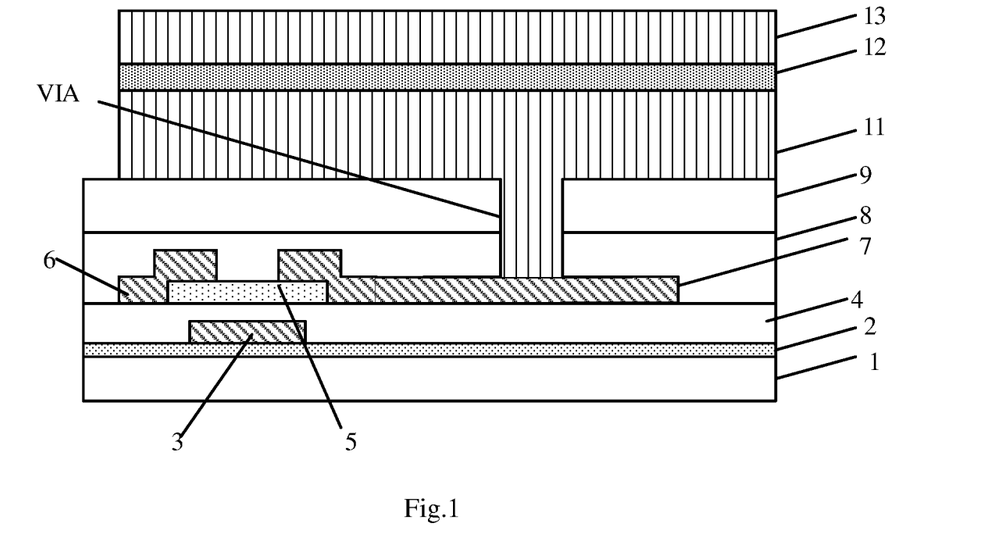
FIG. 1 is a schematic view of a photosensitive sensor of some embodiments of the present disclosure.

In a specific example, as shown in FIG. 1, the photosensitive sensor in the embodiments of the present disclosure includes: a flexible substrate 2; a gate electrode 3 of a thin film transistor on the flexible substrate 2; a gate insulating layer 4 on the gate electrode 3; an active layer 5, a source electrode 6 and a drain electrode 7 of the thin film transistor on the gate insulating layer 4; a passivation layer 8 on the active layer 5, the source electrode 6 and the drain electrode 7 of the thin film transistor; a planarization layer 9 on the passivation layer 8; a second electrode 11 on the planarization layer 9; a photosensitive layer 12 on the second electrode 11; a first electrode 13 on the photosensitive layer 12. The second electrode 11 is connected to the drain electrode 7 through a via hole VIA, and the second electrode 11 is formed of a triple-layer structure including ITO/Ag/ITO. The triple-layer structure may shield the active layer of the thin film transistor to ensure the performance of the photosensitive sensor, and may avoid a special step of manufacturing an additional light shielding layer, thus simplifying the structure and the manufacturing process of the photosensitive sensor and improving a production capacity of the photosensitive sensor.

Embodiments of the present disclosure also provide an electronic device including the photosensitive sensor as described above.

The electronic device may be a display device including a product or a component capable of displaying, such as a TV, a display, a digital photo frame, a mobile phone, a tablet computer, and the like, wherein the display device further includes a flexible circuit board, a printed circuit board, and a backboard.

The electronic device may also be a fingerprint identification device or a wearable device.

The embodiments of the present disclosure also provide a method of manufacturing a photosensitive sensor. The method of manufacturing the photosensitive sensor may be used to manufacture the photosensitive sensor as described above. The method includes forming a thin film transistor and a photosensitive element on a substrate.

Forming the photosensitive element includes forming a first electrode, a second electrode, and a photosensitive layer between the first electrode and the second electrode, wherein the second electrode is connected to the drain electrode of the thin film transistor.

Forming the second electrode includes: forming the second electrode by using at least two conductive layers stacked one above another, wherein an orthographic projection of an active layer of the thin film transistor on the substrate is within an orthographic projection of the second electrode on the substrate, and at least one of the at least two conductive layers is formed as a light shielding metal layer.

In some embodiments of the present disclosure, the second electrode includes a light shielding metal layer, so that no additional light shielding layer is needed, and a channel of the thin film transistor may be shielded by the second electrode, so as to prevent external light from being irradiated to the active layer of the thin film transistor and therefore affecting the performance of the thin film transistor. Thus, a structure and a manufacturing process of the photosensitive sensor may be simplified and the production capacity of the photosensitive sensor may be improved.

In a specific example, the photosensitive layer may be formed of an organic photosensitive material, and the organic photosensitive material will generate electric charges after being irradiated by infrared light or X-rays, and thus may be applied to scenes of fingerprint recognition, facial recognition or X-ray recognition.

In a case that the photosensitive layer is made of the organic photosensitive material, a conductive layer of the at least two conductive layer in contact with the photosensitive layer is made of ITO (indium tin oxide), in order to match a work function of the organic photosensitive material and effectively lead out the electric charges generated by the organic photosensitive material. The ITO is matched with the work function of the organic photosensitive material, and may effectively lead out the electric charges generated by the organic photosensitive material.

In the at least two conductive layers stacked one above another, the light shielding metal layer may be a metal layer made of Cu, Ag, Al, Mo, or Ti, as long as the metal layer may block the light. Optionally, the light shielding metal layer is made of Ag, because the Ag and the ITO may be etched by using the same etching liquid, so that when a pattern of the second electrode is formed by using a wet etching process, the etching liquid is not required to be replaced, and only the same etching liquid may etch both the Ag and the ITO.

The second electrode may include two, three or more conductive layers. In a specific example, forming the second electrode includes forming the second electrode including three conductive layers, wherein the three conductive layers are made of ITO, Ag, and ITO, respectively.

In order to irradiate external light onto the photosensitive layer, the first electrode needs to be designed to be light transmissible, and the first electrode may be a patterned metal pattern or an entire layer of transparent conductive layer. Optionally, the first electrode is formed as an entire layer of transparent conductive layer, such that the first electrode may be arranged to an entirety of a surface of the photosensitive sensor, so that a uniform electric field is generated between the entirely planar second electrode and the first electrode and is favorable to photo-generated charges.

Figure 10:
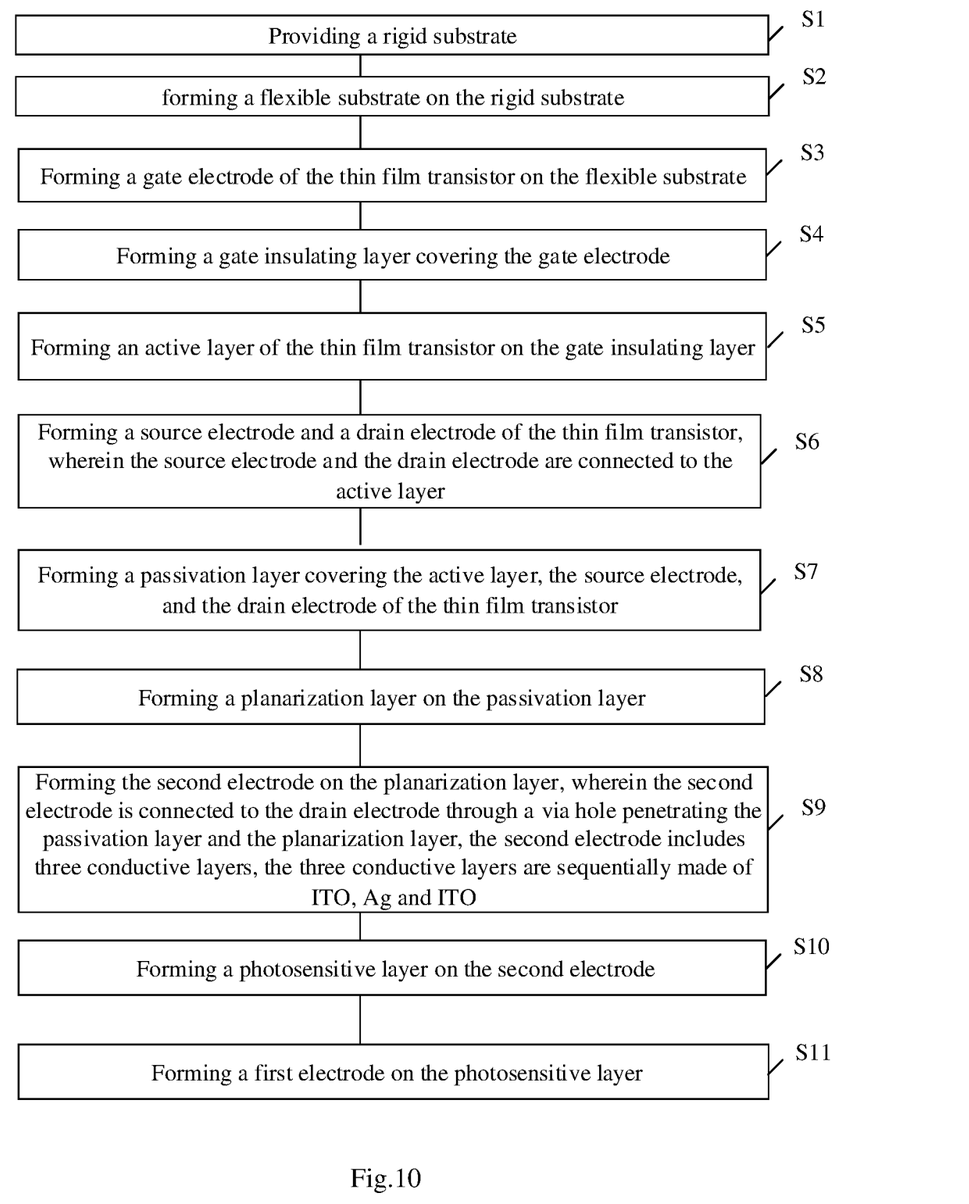
FIG. 10 is a flowchart of a method of manufacturing a photosensitive sensor according to some embodiments of the present disclosure.

Further, referring to FIG. 10, the method specifically includes the following steps S1-S11.

S1: providing a rigid substrate;
S2: forming a flexible substrate on the rigid substrate;
S3: forming a gate electrode of the thin film transistor on the flexible substrate;
S4: forming a gate insulating layer covering the gate electrode;
S5: forming an active layer of the thin film transistor on the gate insulating layer;
S6: forming a source electrode and a drain electrode of the thin film transistor, wherein the source electrode and the drain electrode are connected to the active layer;
S7: forming a passivation layer covering the active layer, the source electrode, and the drain electrode of the thin film transistor;
S8: forming a planarization layer on the passivation layer;
S9: forming the second electrode on the planarization layer, wherein the second electrode is connected to the drain electrode through a via hole penetrating the passivation layer and the planarization layer, the second electrode includes three conductive layers, the three conductive layers are sequentially made of ITO, Ag and ITO;
S10: forming a photosensitive layer on the second electrode;
S11: forming a first electrode on the photosensitive layer.

After step S11, the flexible substrate may also be peeled off from the rigid substrate, so that a flexible photosensitive sensor may be obtained, which may be applied to a wearable device.

As shown in FIG. 2 to FIG. 9, the method of manufacturing the photosensitive sensor of the present example specifically includes following steps.

Figure 2:
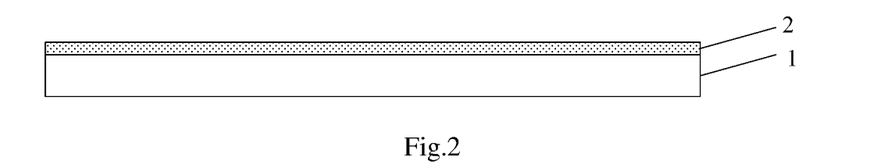
FIG. 2 to FIG. 9 are schematic flowcharts of manufacturing a photosensitive sensor according to some embodiments of the present disclosure.

Step 1: as shown in FIG. 2, providing a rigid substrate 1, and forming a flexible substrate 2 on the rigid substrate 1.

The rigid substrate 1 may be a glass substrate or a quartz substrate. The flexible substrate 2 may be made of PI (polyimide). Further, a buffer layer may be formed on the flexible substrate 2. The buffer layer may be a single layer structure or a multilayer structure, and the buffer layer may be formed of SiOx, SiNx, SiON or the like.

Figure 3:
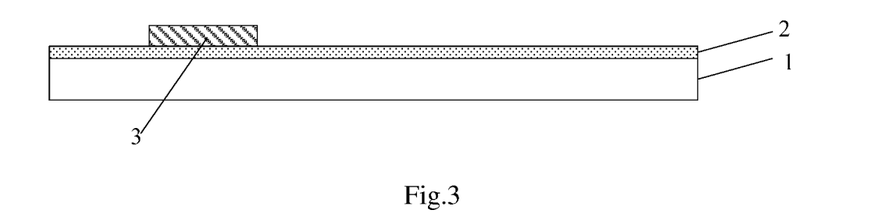

Step 2: as shown in FIG. 3, forming a gate electrode 3 of the thin film transistor on the flexible substrate 2.

Specifically, a gate metal layer having a thickness of about 500 Å to 4000 Å may be deposited by sputtering or thermal evaporation on the flexible substrate after the step 1 is completed; the gate metal layer may be made of Cu, Al, Ag, Mo, Cr, Nd, Ni, Mn, Ti, Ta, W, and alloys of these metals; the gate metal layer may be a single layer structure or a multilayer structure formed of such as Cu\Mo, Ti\Cu\Ti, Mo\Al\Mo or the like. A photoresist is coated on the gate metal layer, and the photoresist is exposed by using a mask to form a photoresist-unreserved region and a photoresist-reserved region, wherein the photoresist-reserved region corresponds to a region at which a pattern of the gate electrode 3 is located, the photoresist-unreserved region corresponds to a region other than the region at which the pattern of the gate electrode 3 is formed; a developing process is performed, after which photoresist in the photoresist-unreserved region is completely removed, and a thickness of photoresist in the photoresist-reserved region remains unchanged; the gate metal layer at the photoresist-unreserved region is completely etched away by an etching process, and photoresist remained after the etching is stripped off to form a pattern of the gate electrode 3.

Figure 4:
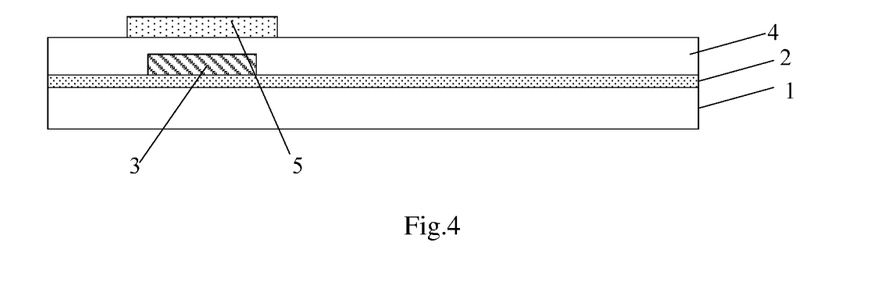

Step 3: as shown in FIG. 4, forming a gate insulating layer 4 and an active layer 5 of the thin film transistor.

Specifically, an insulating layer and a semiconductor layer may be sequentially deposited on the flexible substrate 2 after the step 2 is performed; photoresist is coated on the semiconductor layer, and the photoresist is exposed by using a halftone mask or a gray tone mask. After the photoresist is developed, a photoresist completely-reserved region, a photoresist partially-reserved region, and a photoresist completely-removed region are formed; the semiconductor layer corresponding to the photoresist completely-removed region is removed by a wet etching process to form a pattern of the active layer 5; the photoresist in the photoresist partially-reserved region is subjected to an ashing process, and the insulating layer corresponding to the photoresist partially-reserved region is removed by using a dry etching process to form a pattern of the gate insulating layer 4, and remaining photoresist is stripping off.

The active layer 5 may be formed of a-Si, IGZO, IZO, IGZXO, IGZYO or the like. The gate insulating layer 4 may be formed of an oxide, a nitride or an oxynitride compound, and a corresponding reaction gas is $SiH_4$, $NH_3$, $N_2$ or $SiH_2Cl_2$, $NH_3$, $N_2$.

Figure 5:
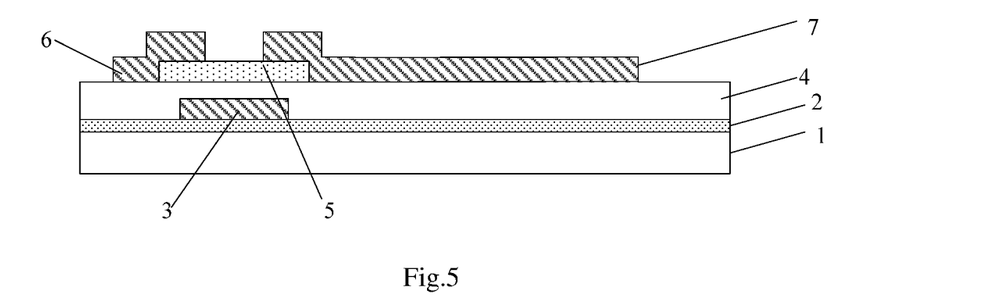

Step 4: as shown in FIG. 5, forming the source electrode 6 and the drain electrode 7 of the thin film transistor.

Specifically, a source/drain metal layer having a thickness of about 2000 Å to 4000 Å may be deposited on the flexible substrate by magnetron sputtering, thermal evaporation or other film formation process after the step 3 is completed. The source/drain metal layer may be made of Cu, Al, Ag, Mo, Cr, Nd, Ni, Mn, Ti, Ta, W or the like and alloys of these metals. The source/drain metal layer may be a single-layer structure or a multilayer structure formed of such as Cu\Mo, Ti\Cu\Ti, Mo\Al\Mo or the like. Photoresist is coated on the source/drain metal layer, and the photoresist is exposed by using a mask to form a photoresist unreserved region and a photoresist reserved region, wherein the photoresist reserved region corresponds to regions at which patterns of the source electrode 6 and the drain electrode 7 are located, the photoresist unreserved region corresponds to a region other than the regions at which patterns of the source electrode 6 and the drain electrode 7 are located; a development process is performed, the photoresist in the photoresist unreserved region is completely removed, and a thickness of the photoresist in the photo reserved region remains unchanged; the source/drain metal layer in the photoresist unreserved region is completely etched away by an etching process, and the remaining photoresist is stripped off to form the source electrode 6 and the drain electrode 7.

Figure 6:
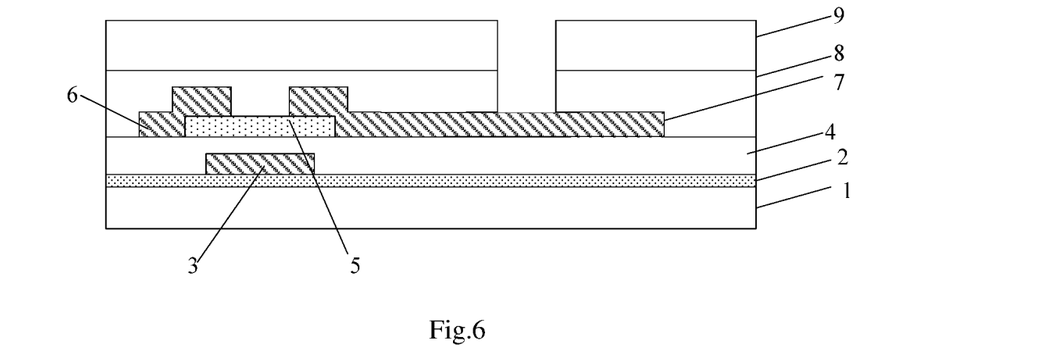

Step 5: as shown in FIG. 6, forming a passivation layer 8 and a planarization layer 9.

Specifically, a layer of passivation material and a layer of planarization material are sequentially deposited on the flexible substrate after the step 4 is performed. The planarization material may be an organic photosensitive resin, and after an exposure is performed, the planarization layer 9 with a via hole VIA formed therein is formed. By using the pattern of the planarization layer 9 as a mask, the layer of passivation material is dry-etched to form the passivation layer 8 with the via hole VIA formed therein.

Figure 7:
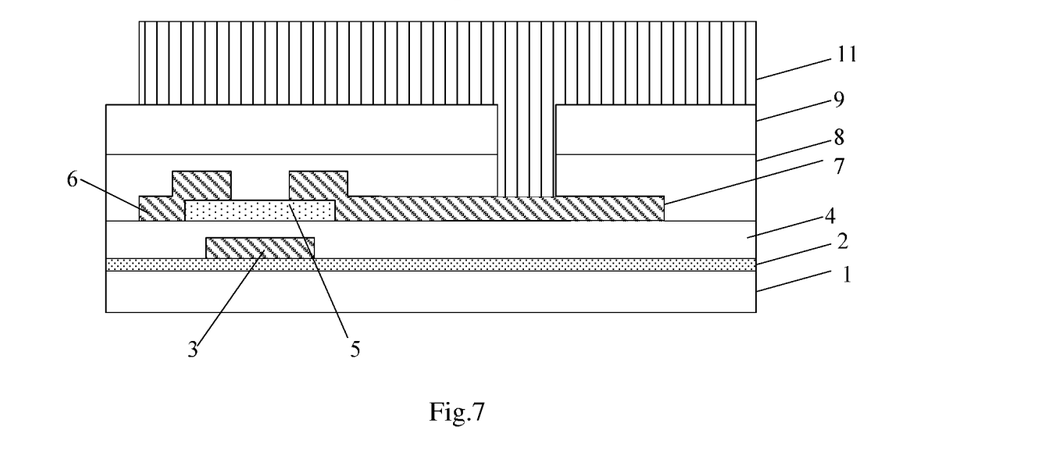

Step 6: as shown in FIG. 7, forming a second electrode 11.

Specifically, ITO, Ag, and ITO may be sequentially deposited on the flexible substrate after the step 5 is performed, and the triple-layer structure including the ITO/Ag/ITO is patterned to form a pattern of the second electrode 11, and the second electrode 11 is connected to the drain electrode 7 through the via hole VIA in the passivation layer 8 and the planarization layer 9.

Figure 8:
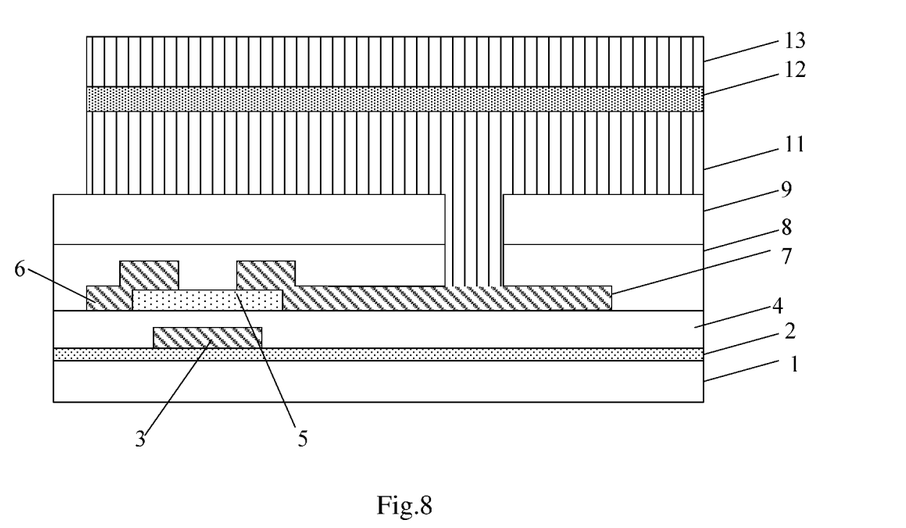

Step 7: as shown in FIG. 8, forming a photosensitive layer 12 and a first electrode 13.

Specifically, a layer of photosensitive material may be deposited on the flexible substrate after the step 6 is performed, and the layer of photosensitive material may be patterned to form the photosensitive layer 12.

A transparent conductive material is then deposited, and the transparent conductive material is patterned to form the first electrode 13.

Figure 9:
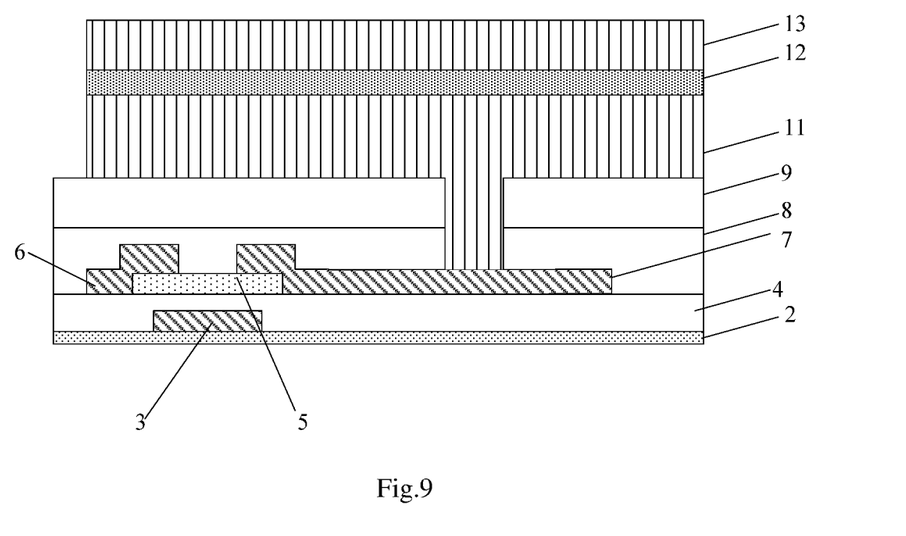

Step 8: as shown in FIG. 9, stripping off the flexible substrate 2 from the rigid substrate 1 to obtain a flexible photosensitive sensor.

Specifically, the flexible substrate 2 may be stripped off from the rigid substrate 1 by using LLO (a Laser Lift Off technique).

The embodiments of the present disclosure have following beneficial effects. In the above solutions, the second electrode includes the light shielding metal layer, so that no additional light shielding layer is needed, and a channel of the thin film transistor may be blocked by the second electrode to prevent external light from being irradiated onto the active layer of the thin film transistor and affecting the performance of the thin film transistor. A structure and a manufacturing process of the photosensitive sensor may be simplified and a production capacity of the photosensitive sensor may be increased.

In the method embodiments of the present disclosure, sequence numbers of the steps are not used to limit a sequence of steps. For those skilled in the art, variations of the sequence of the steps without any creative work by one of ordinary skills in the art are also within the scope of the present disclosure.

Unless otherwise defined, technical terms or scientific terms used in the present disclosure are intended to have ordinary meanings understood by one of ordinary skills in the art to which the present disclosure belongs. Such words as "first", "second", or the like used in the present disclosure do not denote any order, quantity, or importance, but are used to distinguish different components. Such word "including" or "comprises" or the like means that an element or an item preceding the word encompasses an element or article or equivalent element or article thereof listed behind the word, without precluding other elements or articles. Such words as "connected" or "connecting" or the like are not limited to physical or mechanical connections, but may include electrical connections, whether direct connections or indirect connections. Words such as "upper", "lower", "left", "right", etc. are only used to indicate a relative positional relation, and when an absolute position of an object being described is changed, the relative positional relation may also be changed accordingly.

It will be understood that when an element such as a layer, a film, a region or a substrate is referred to as being "on" or "below" another element, the element may be "directly on" or "directly below" the another element, or there may exist an intermediate element.

The above are optional embodiments of the present disclosure, and it should be noted that those skilled in the art may also make several improvements and refinements without departing from the principles of the present disclosure. The improvements and refinements should also be considered to be within the protection scope of the present disclosure.

What is claimed is:

1. A photosensitive sensor, comprising:
   a thin film transistor on a substrate;
   a passivation layer above the thin film transistor, wherein an entirety of an upper surface of the passivation layer is a planar surface;
   a planarization layer above the passivation layer and directly contacting with the upper surface of the passivation layer, wherein an entirety of an upper surface of the planarization layer is a planar surface; and a photosensitive element above the planarization layer and directly contacting the upper surface of the planarization layer, wherein the photosensitive element comprises a first electrode, a second electrode, and a photosensitive layer between the first electrode and the second electrode, and the second electrode is connected to a drain electrode of the thin film transistor through a via hole penetrating through the planarization layer and the passivation layer; and wherein an entirety of the first electrode is a planar electrode, an entirety of the photosensitive layer is a planar layer, and wherein an orthographic projection of an active layer of the thin film transistor on the substrate is within an orthographic projection of the second electrode on the substrate, and the second electrode comprises at least two stacked conductive layers, at least one of the at least two stacked conductive layers being a light shielding metal layer.

2. The photosensitive sensor according to claim 1, wherein the photosensitive layer is made of an organic photosensitive material.

3. The photosensitive sensor according to claim 2, wherein one of the at least two stacked conductive layers is directly in contact with the photosensitive layer and is made of indium tin oxide.

4. The photosensitive sensor according to claim 3, wherein the second electrode comprises three conductive layers, and the three conductive layers are formed of indium tin oxide, silver, and indium tin oxide, respectively.

5. The photosensitive sensor according to claim 1, wherein the first electrode is a transparent conductive layer.

6. The photosensitive sensor according to claim 1, wherein the light shielding metal layer is formed of at least one of Cu, Ag, Al, Mo, or Ti.

7. The photosensitive sensor according to claim 1, wherein the substrate is a flexible substrate.

8. The photosensitive sensor according to claim 7, wherein the thin film transistor comprises: a gate electrode on the flexible substrate, a gate insulating layer on the gate electrode, an active layer and a source electrode connected to the active layer, and the drain electrode connected to the active layer on the gate insulating layer; and wherein the passivation layer is above the active layer, the source electrode and the drain electrode of the thin film transistor, an entirety of an upper surface of the gate insulating layer is a planar surface.

9. The photosensitive sensor according to claim 8, wherein a side surface of the via hole is perpendicular to the upper surface of the passivation layer and the upper surface of the planarization layer.

10. An electronic device, comprising:
the photosensitive sensor according to claim 1.

11. A method of manufacturing a photosensitive sensor, comprising:
forming a thin film transistor on a substrate;
forming a passivation layer above the thin film transistor;
wherein an entirety of an upper surface of the passivation layer is a planar surface;
forming a planarization layer above the passivation layer and directly contacting with the upper surface of the passivation layer, wherein an entirety of an upper surface of the planarization layer is a planar surface; and forming a photosensitive element above the planarization layer and directly contacting the upper surface of the planarization layer;

wherein forming the photosensitive element comprises forming a first electrode, a second electrode, and a photosensitive layer between the first electrode and the second electrode, and the second electrode is connected to a drain electrode of the thin film transistor through a via hole penetrating through the planarization layer and the passivation layer;

wherein an entirety of the first electrode is a planar electrode, an entirety of the photosensitive layer is a planar layer, and wherein forming the second electrode comprises:
forming the second electrode by using at least two stacked conductive layers, wherein an orthographic projection of an active layer of the thin film transistor on the substrate is within an orthographic projection of the second electrode on the substrate, and at least one of the at least two stacked conductive layers is a light shielding metal layer.

12. The method according to claim 11, wherein one of the at least two stacked conductive layers is directly in contact with the photosensitive layer and is made of indium tin oxide.

13. The method according to claim 12, wherein forming the second electrode specifically comprises:
forming the second electrode comprising three conductive layers, wherein the three conductive layers are respectively made of indium tin oxide, silver, and indium tin oxide.

14. The method according to claim 11, wherein the light shielding metal layer is formed of at least one of Cu, Ag, Al, Mo, or Ti.

15. The method according to claim 11, wherein:
the substrate is a flexible substrate;
before forming the thin film transistor on the substrate, the method further comprises:
providing a rigid substrate; and
forming the flexible substrate on the rigid substrate; and
forming the thin film transistor on the substrate comprises:
forming a gate electrode of the thin film transistor on the flexible substrate;
forming a gate insulating layer covering the gate electrode;
forming an active layer of the thin film transistor on the gate insulating layer; and
forming a source electrode and a drain electrode of the thin film transistor, wherein the source electrode and the drain electrode are connected to the active layer.

16. The method according to claim 15, further comprising:
stripping the flexible substrate off the rigid substrate to form a flexible photosensitive sensor.

* * * * *